United States Patent
Koburger, III et al.

(10) Patent No.: US 8,198,700 B2
(45) Date of Patent: Jun. 12, 2012

(54) DEEP WELL STRUCTURES WITH SINGLE DEPTH SHALLOW TRENCH ISOLATION REGIONS

(75) Inventors: Charles W. Koburger, III, Albany, NY (US); Peter Zeitzoff, Albany, NY (US); Mariko Takayanagi, Albany, NY (US)

(73) Assignees: International Business Machines Corporation, Armonk, NY (US); Kabushiki Kaisha Toshiba (JP); Freescale Semiconductors Inc., Austin, TX (US)

( * ) Notice: Subject to any disclaimer, the term of this patent is extended or adjusted under 35 U.S.C. 154(b) by 210 days.

(21) Appl. No.: 12/691,196

(22) Filed: Jan. 21, 2010

(65) Prior Publication Data

US 2011/0175190 A1    Jul. 21, 2011

(51) Int. Cl.
*H01L 27/092*    (2006.01)
(52) U.S. Cl. .............................. 257/515; 257/E29.02
(58) Field of Classification Search .................. 257/510, 257/515, 519, 547, E29.02
See application file for complete search history.

(56) References Cited

U.S. PATENT DOCUMENTS

| | | | |
|---|---|---|---|
| 6,946,710 B2 | 9/2005 | Logan et al. | |
| 2006/0267103 A1* | 11/2006 | Tanaka | 257/369 |
| 2008/0217729 A1* | 9/2008 | Disney et al. | 257/513 |
| 2008/0283890 A1 | 11/2008 | Dyer | |

* cited by examiner

*Primary Examiner* — Wensing Kuo
(74) *Attorney, Agent, or Firm* — Cantor Colburn LLP; Yuanmin Cai

(57) ABSTRACT

A semiconductor device structure includes a first type region and a second type region defined in a substrate, the first type region and second type region separated by one or more inter-well shallow trench isolation (STI) structures. At least one of the first type region and the second type region has one or more intra-well STI structures formed therein for isolating semiconductor devices formed within a same polarity well. The inter-well STI structures are formed at a substantially same depth with respect to the intra-well STI structures. A main well region is formed such that a bottom of the main well region is disposed above a bottom of the inter-well and intra-well STI features. One or more deep well regions couple the main well regions otherwise isolated by the intra-well STI structures, wherein the deep well regions are spaced away from the inter-well STI structures.

3 Claims, 5 Drawing Sheets

DEEP WELL STRUCTURES WITH SINGLE DEPTH SHALLOW TRENCH ISOLATION REGIONS

BACKGROUND

The present invention relates generally to integrated circuit (IC) device fabrication and, more particularly, to deep well structures with single depth, inter-well and intra-well shallow trench isolation regions.

A typical semiconductor device in a complementary metal-oxide-semiconductor (CMOS) circuit is formed in a p-well or an n-well in a semiconductor substrate. Since other semiconductor devices are also present in the semiconductor substrate, a given semiconductor device requires electrical isolation from adjacent semiconductor devices. Electrical isolation is provided by isolation structures that employ trenches filled with an insulator material (e.g., shallow trench isolation or "STI" regions). The electrical isolation of a semiconductor device from other devices located in the same well is referred to as "intra-well" isolation. In contrast, the electrical isolation of a semiconductor device from other devices in an adjacent well (typically of the opposite polarity type, but could also be a same polarity type well of a different well bias) is referred to as "inter-well" isolation. In either case, the unintended functionality of parasitic devices, such as parasitic p-n-p or n-p-n bipolar transistors, defined by various elements of the semiconductor device and adjacent semiconductor devices, needs to be suppressed. This is typically done by placing a dielectric material, such as an STI structure, in the current paths of the elements of the parasitic devices.

However, electrical isolation between n-well and p-well regions in bulk CMOS technologies presents somewhat of a quandary. On the one hand, leakage current between n-wells and adjacent p-wells is minimized (and latchup parameters are improved) by having STI features that penetrate all the way through the bottoms of the highly doped (deep) well regions. These deep STI features force potential latchup currents deep into the substrate and separate active regions in adjacent oppositely doped wells, thus providing good inter-well isolation. On the other hand, an STI must be sufficiently shallow so that distinct devices within the same polarity well (e.g., an n-well) are not cut off from one other. That is, for intra-well isolation, the STI must be shallower than the bottom of the doped well to also achieve reasonable intra-well resistances.

Perhaps the most commonly suggested method for eliminating this quandary is to use two separate STI depths, one for inter-well isolation and another for intra-well isolation. More specifically, shallow STI (i.e., "shallow trench isolation") is used between devices within the same well for intra-well isolation, while deep STI (i.e., "deep shallow trench isolation") is used between wells for inter-well isolation. Unfortunately, problems with this dual-depth STI approach include the cost of an additional critical STI mask and etch, as well as the difficulty in etching and filling the higher aspect ratio trenches that result (e.g., aspect ratios of >10:1 for 22 nanometer deep STI). In addition, the lateral scattering and diffusion of deep well dopants, typically added to wells via high-energy implants, as well as potential misalignment of masks used to define the well's positions may also limit the minimum n+ to p+ spacing to much wider dimensions than are compatible with aggressively scaled SRAM (and other circuit device) features.

SUMMARY

The drawbacks and deficiencies of the prior art are overcome or alleviated, in an exemplary embodiment, by a semiconductor device structure that includes a first type region and a second type region defined in a substrate, the first type region and second type region separated by one or more inter-well shallow trench isolation (STI) structures; at least one of the first type region and the second type region having one or more intra-well STI structures formed therein for isolating semiconductor devices formed within a same well, wherein the one or more inter-well STI structures are formed at a substantially same depth with respect to the one or more intra-well STI structures; the at least one of the first type region and the second type region further having a main well region formed therein, wherein a bottom of the main well region is disposed above a bottom of the one or more inter-well and intra-well STI features; and the at least one of the first type region and the second type region further having one or more deep well regions formed therein that couple main well regions otherwise isolated by the one or more intra-well STI structures, wherein the one or more deep well regions are spaced away from the one or more inter-well STI structures.

In another embodiment, a semiconductor device structure includes a p-type metal oxide semiconductor (PMOS) region and an n-type metal oxide semiconductor (NMOS) region defined in a substrate, the PMOS region and NMOS region separated by one or more inter-well shallow trench isolation (STI) structures; the PMOS region having a first set of intra-well STI structures formed therein for isolating semiconductor devices formed within an n-type well and the NMOS region having a second set of intra-well STI structures formed therein for isolating semiconductor devices formed within a p-type well, wherein the one or more inter-well STI structures are formed at a substantially same depth with respect to the first and second sets of intra-well STI structures; the PMOS region further having a main n-well region formed therein, and the NMOS region further having a main p-well region formed therein, wherein a bottom of the main n-well region and the main p-well regions is disposed above a bottom of the one or more inter-well and first and second sets of intra-well STI features; the PMOS region further having one or more deep n-well regions formed therein that couple main n-well and regions otherwise isolated by the first set of intra-well STI structures; and the NMOS region further having one or more deep p-well regions formed therein that couple main p-well and regions otherwise isolated by the second set of intra-well STI structures; wherein the one or more deep n-well and deep p-well regions are spaced away from the one or more inter-well STI structures.

In still another embodiment, a method of forming a semiconductor device includes defining a first type region and a second type region in a substrate, the first type region and second type region separated by one or more inter-well shallow trench isolation (STI) structures; etching and filling, in at least one of the first type region and the second type region, one or more intra-well STI structures for isolating semiconductor devices formed within a same polarity well, wherein the one or more inter-well STI structures are formed at a substantially same depth with respect to the one or more intra-well STI structures; implanting, in the at least one of the first type region and the second type region, a main well region, wherein a bottom of the main well region is disposed above a bottom of the one or more inter-well and intra-well STI features; and implanting, in the at least one of the first type region and the second type region, one or more deep well regions that couple main well regions otherwise isolated by the one or more intra-well STI structures, wherein the one or more deep well regions are spaced away from the one or more inter-well STI structures.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
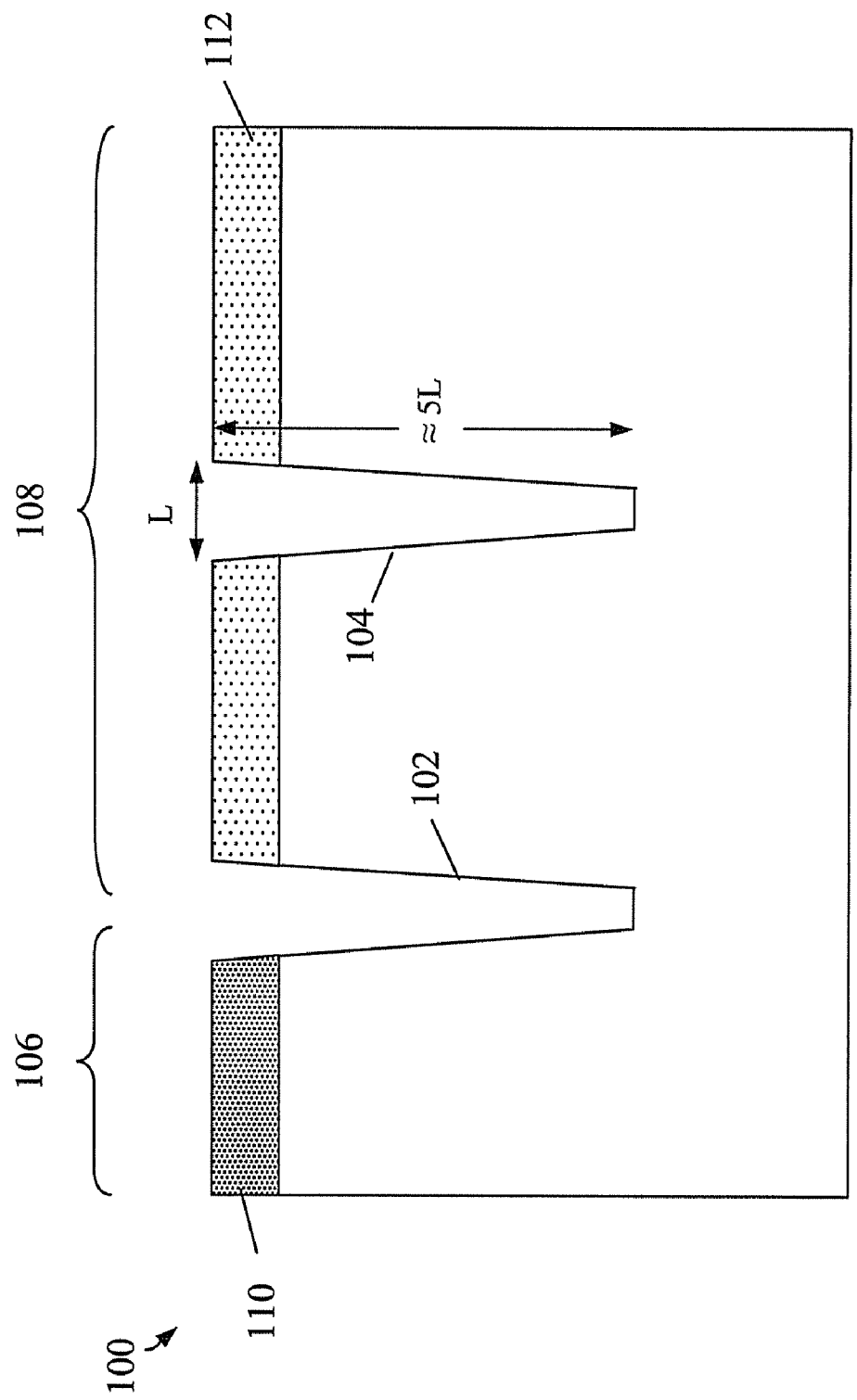
FIG. 1 is a cross-sectional view of a pair of trenches formed in a CMOS substrate, one of which serves as an inter-well STI and the other of which serves as an intra-well STI, suitable for use in accordance with an embodiment of the invention.

Disclosed herein is a semiconductor device providing deep well implant structures with single depth, inter-well and intra-well shallow trench isolation regions. Generally stated, a single STI depth is utilized in combination with doping the well(s) twice—once with a relatively shallow dopant profile whose bottom is above the STI depth, and second with a deeper dopant profile that is deeper than the STI depth. The lateral extent of the shallow dopant profile encompasses the entirety of the well boundaries, while the lateral extent of the deeper dopant profile is located substantially throughout the well, except for the regions adjacent to wells of the opposite polarity type. In so doing, the deeper dopant profile electrically connects same polarity type well portions separated by intra-well STIs, while the shallow dopant profile improves latchup and sets desired device behavior for individual devices formed at the well surfaces.

If the substrate is p-type, then it is conceivable that only the n-wells may require the deep profile; the shallow profile alone may suffice for p-wells because substrate doping will connect p-wells separated by STIs. Regardless, a principal advantage of the presently disclosed embodiments is that it is a relatively simple process, avoiding the need for dual-depth STI formation and the attendant problems associated therewith. Moreover, simple block masks can be used for the deep dopant profiles. Furthermore, since the deep well profiles are not immediately adjacent the border between p-wells and n-wells, problems with minimum n+ to p+ spacing discussed above should be much reduced.

As illustrated in further detail below, one particular exemplary embodiment utilizes masked implants to form the shallow n-well and p-well profiles. These shallow implants are above the (single) STI depth, to the point where the implanted well(s) are completely cut off by the STI. Then, one or more second well masks are utilized to add deep implants to electrically connect adjacent wells of the same doping type. This deep doping would penetrate below the depth of the STI, but would be sufficiently removed from the oppositely doped well regions and from borders therebetween.

For example, one exemplary process flow would remove the deepest n-well implants from the n-well implant sequence (and other n-well implants that penetrate below the STI depth). Then a second n-well mask is employed to add desired deep well implants to connect devices residing completely within the same n-well. These deep implants would be masked so that they stay away from closely spaced p-well regions. In addition, p-well processing (well implants and masks) would be adjusted to provide sufficient p-type substrate conductivity and latchup resistance.

In another contemplated embodiment, the deep dopant profile(s) is defined prior to filling the isolation trenches. The additional masking step(s) is performed just after STI reactive ion etching (RIE) or after STI sidewall passivation. Similar to the first embodiment, an (added) mask protects borders between opposite polarity wells (and oppositely doped wells), and defines regions into which shallow doping profiles are introduced. This shallow doping can be performed using ion implantation at sufficiently low energy so that a pad nitride absorbs ions that would otherwise affect active regions, or via direction "infusion" (cluster beam doping or other variations). The specific embodiments have the advantage of utilizing well-known process techniques and relative simplicity compared to dual-depth STI.

Referring initially to FIG. 1, there is shown cross-sectional view of a CMOS substrate 100 having a pair of trenches 102, 104 formed therein suitable for use in accordance with an embodiment of the invention. In the example depicted, region 106 represents an NMOS area of the substrate 100, while region 108 represents a PMOS area of the substrate 100. Thus, trench 102 serves as an inter-well STI feature (bordering the NMOS area 106 and PMOS area 108), while trench 104 serves as an intra-well STI feature (being completely within the PMOS area 108). Both the trench 102 and trench 104 are formed at substantially the same depth and have similar minimum widths, in silicon substrate 100. In an illustrative embodiment, the exemplary dimensions (e.g., aspect ratio approximately 5:1 or more) shown in FIG. 1 may represent a 22 nanometer (nm) node. Also depicted for purposes of illustration in FIG. 1 are an N+ area 110 within the NMOS area 106 and a P+ area 112 within the PMOS area 108, that are typically formed subsequent to well formation, but are nonetheless shown for later reference.

Figure 2:
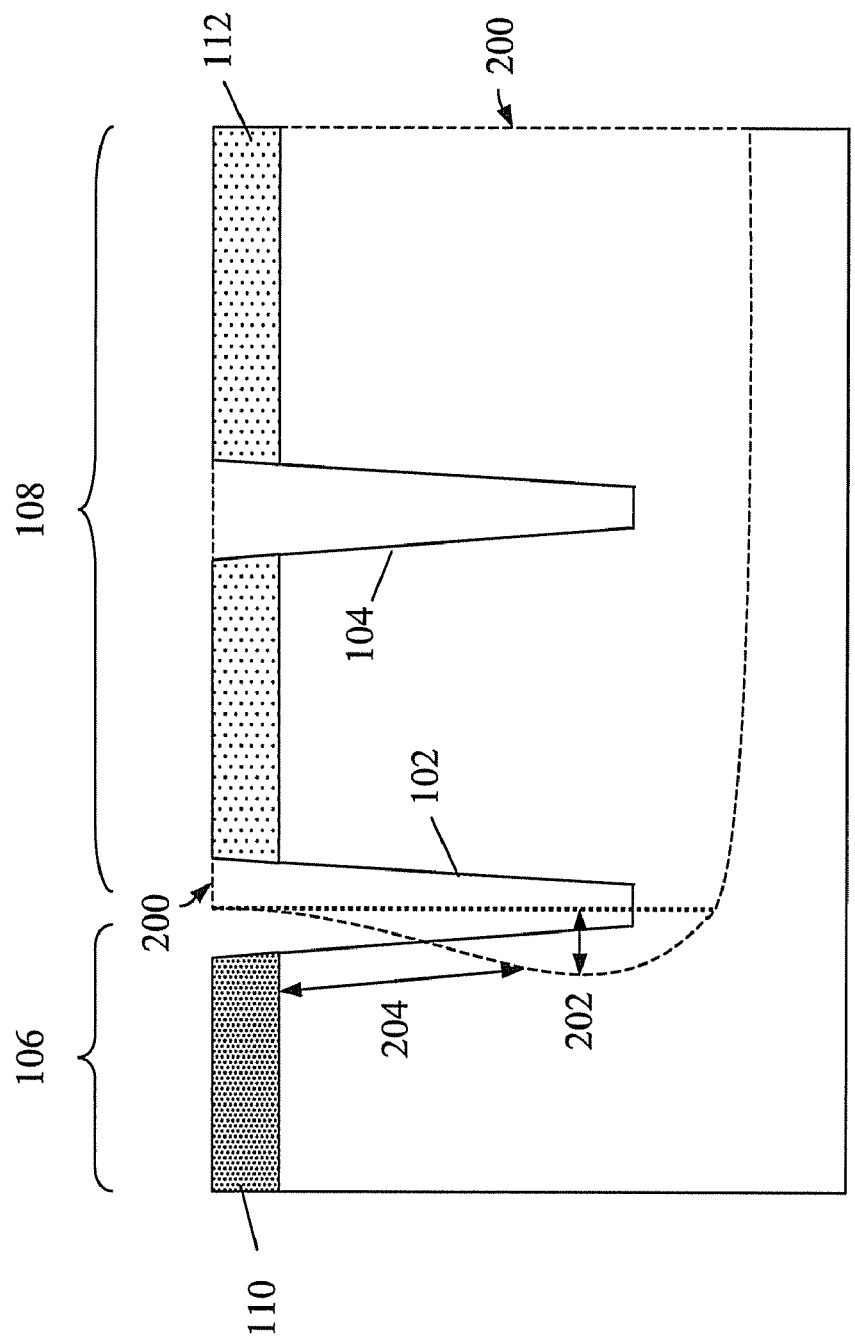
FIG. 2 illustrates an example of lateral bulging of a conventionally formed deep n-well implant of the substrate of FIG. 1.

FIG. 2 illustrates an outline of a typical n-well profile, in this case intended to be perfectly aligned with the center of the inter-well STI feature 102. However, as a practical matter, the actual well profile typically exhibits a bulge 202 therein due to lateral straggle of the high-energy implants needed to achieve low-resistivity doping below the bottoms of the STI features 102, 104. The N+ to n-well distance 204 is a critical parameter in determining (N+) junction leakage, and can become dangerously small as the n-well 200 misaligns to the left or when implant straggle forms n-well pockets on the p-well-facing surface of inter-well STI feature 102.

Figure 3:
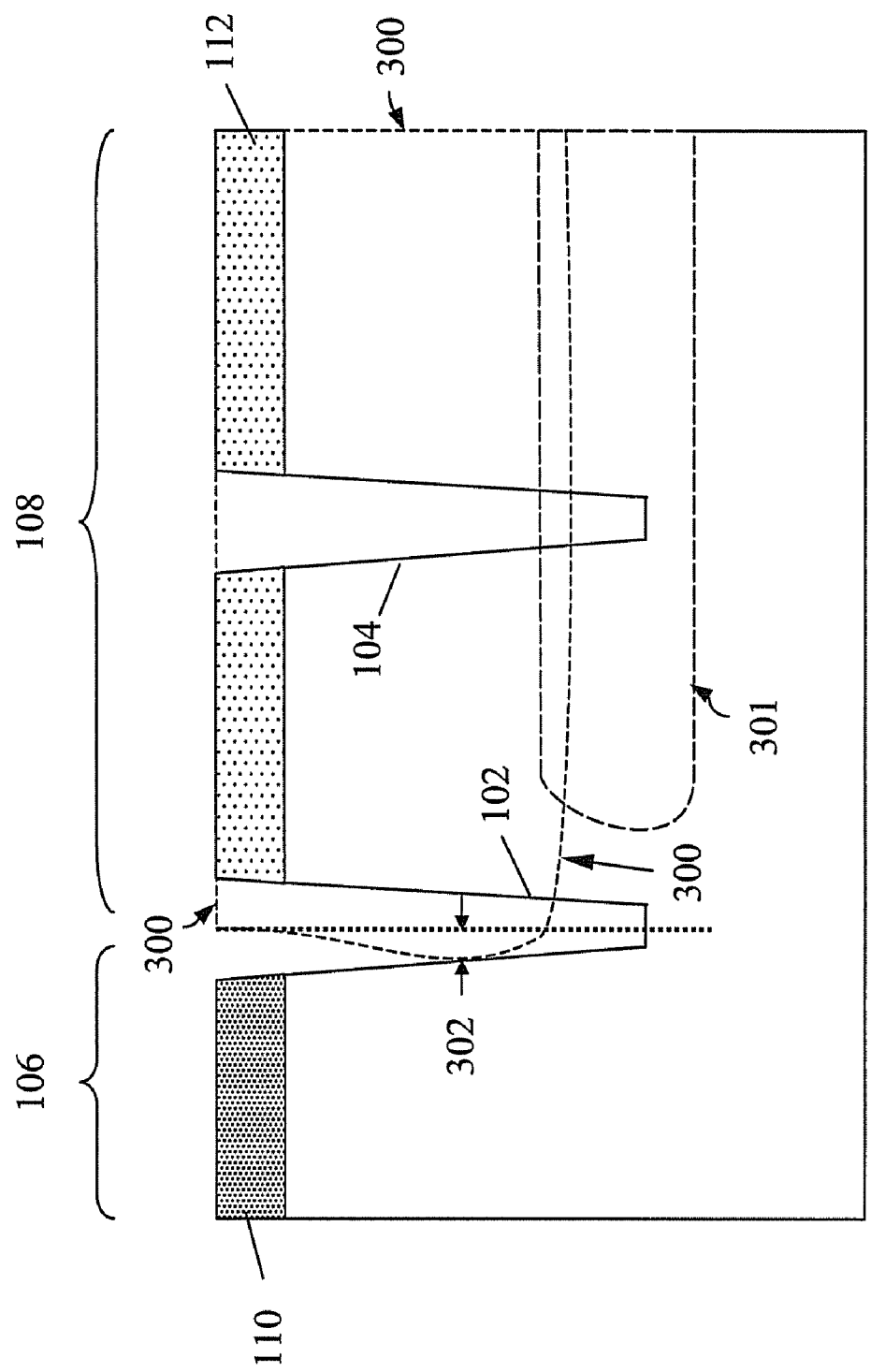
FIG. 3 is a cross-sectional view of first shallow well implant and a second deep well implant formed in the substrate of FIG. 1, in accordance with an embodiment of the invention.

Accordingly, FIG. 3 is a cross-sectional view of a first shallow well implant and a second deep well implant formed in the substrate of FIG. 1, in accordance with an embodiment of the invention. More specifically, a main n-well implant region 300 is defined so that the bottom of the main n-well region 300 lies above the bottom of both the inter-well STI 102 and the intra-well STI 104. As indicated above, the lateral extent of the main n-well region 300 (and main wells in general) encompasses the entirety of the well boundaries. That is, the main well region 300 abuts the inter-well STI features 102 so as to fully occupy active device regions.

In addition, adjacent n-well regions 300 isolated by the deeper intra-well STIs 104 are connected by a deep, separately masked implanted region 301, so that well contacts are not required for each n-well. The deep implant region 301 is patterned so that (unlike the main implant region 300) it does not abut the n-well/p-well border and is adequately spaced away from the inter-well STI region 102. As will further be noted from FIG. 3, any bulges 302 in the main n-well 300 profile due to lateral implant scatter, diffusion, or overlay tolerance will not undercut the inter-well STI regions 102 separating adjacent n- and p-well (or adjacent separately biased n-wells) so N+/n-well leakage is not degraded via that mechanism. However, if the bulge 301 from the medium-depth n-well implants should happen to misalign and/or scatter into a section of an adjacent p-well, it will be isolated from any n-well so that will not contribute to leakage.

With the above described approach, the additional (non-critical) block mask for forming the second, deep implant region 301 will be much less expensive than forming two separate STI depths, and employs existing CMOS technologies.

In an alternative embodiment, it is also contemplated that the deep well implant regions for coupling same polarity well regions may also be formed while the STI trenches are still open (e.g., immediately after sidewall oxidation/passivation). In this case, masked shallow implants (or directional "infusions") of appropriate dopant are formed within the STI bottoms in order to connect adjacent same polarity wells.

Figure 4:
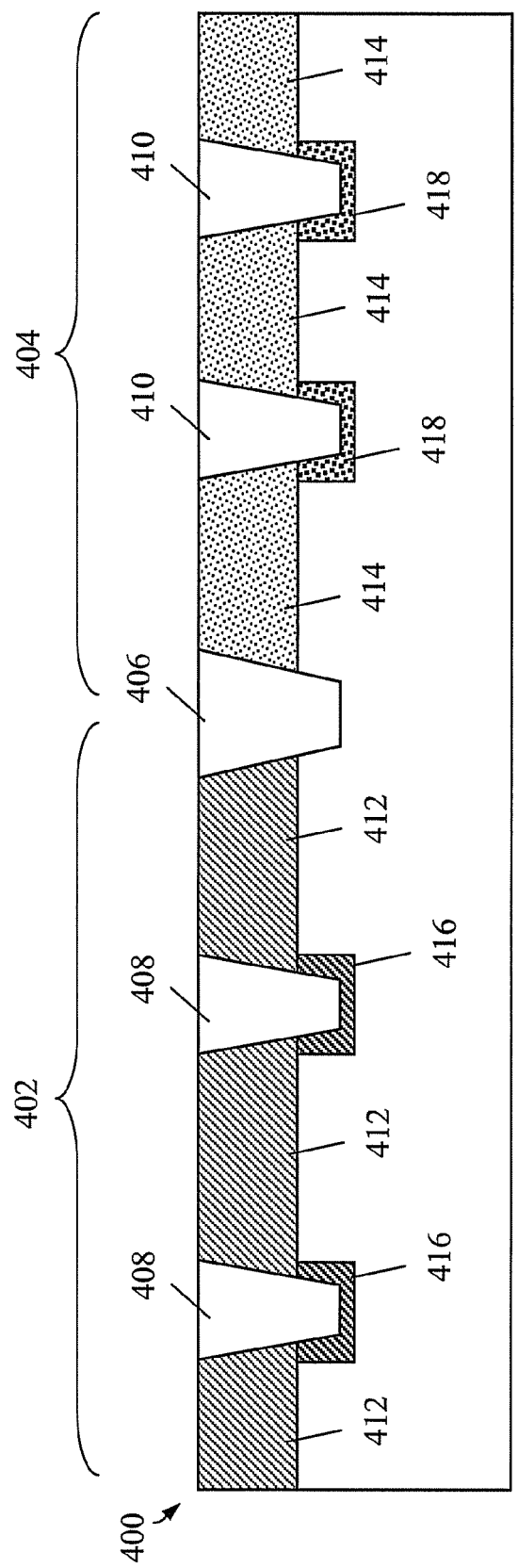
FIG. 4 illustrates an alternative embodiment of the second deep well implant structure of FIG. 3.

In this regard, FIG. 4 is a cross-sectional view of a substrate 400 featuring an alternative embodiment of the second, deep well implant structure of FIG. 3. Similar to FIG. 3, the substrate 400 includes an NMOS area 402 and a PMOS area 404 separated from one another by an inter-well STI 406. Further, the NMOS area 402 also includes intra-well STIs 408 while the PMOS area 404 includes intra-well STIs 410. Again, it will be noted that depth of the both the inter-well STI 406 and intra-well STIs 408, 410 extends below the main well implant regions (i.e., p-well 412 and n-well 414). That is, inter-well STI 406 completely isolates adjacent p-wells 412 and n-wells 414. Here, the second implant structures are formed while the trenches of intra-well STIs 408, 410 are still open. For example, with a pad nitride (not shown) in place, the bottoms of the open intra-well STIs are subjected to shallow ion implantation (I/I) operations so as to define doped regions 416 and 418. The doped regions 416 connect adjacent p-well regions 412 and the doped regions 418 connected adjacent n-well regions 414. The pad nitride protects active regions of the substrate by absorbing the shallow I/I.

Figure 5:
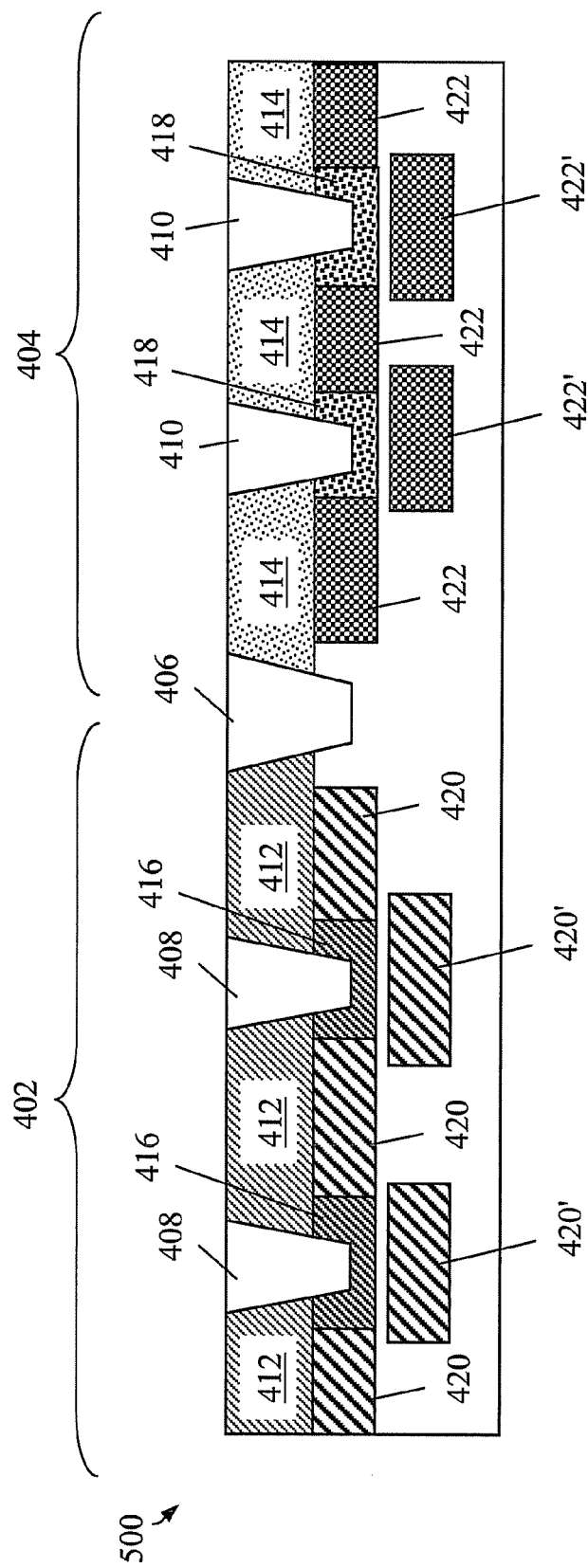
FIG. 5 illustrates another alternative embodiment of the second deep well implant structure of FIGS. 3 and 4.

Finally, FIG. 5 is a cross-sectional view of a substrate 500 that combines the concepts of the second deep well implant structures of FIGS. 3 and 4. For purposes of illustration, similar regions are designated with the same reference numbers as in FIG. 4. In addition to the main p-well and n-well implants 412, 414, the embodiment of FIG. 5 incorporates both the masked shallow I/I process of the open trench bottoms to form doped regions 416, 418 (as in FIG. 4) and a deep implant to form regions 420 and 422 (as in FIG. 3). Similar to the embodiment of FIG. 3, the deep implant of p-well regions 420 and n-well regions 422 is kept away from the p-well/n-well borders edges through an appropriate mask design, but is deep enough to add well "volume" under the bulk of the main wells 412, 414. As will be further noted from FIG. 5, where the deep implant occurs through open STI trenches, well pockets 420', 422' will be formed that may or may not actually connect to the main well. Such additional deep well pockets are harmless. In any case, both the intra-well connecting doped regions 416 and the deep well pockets 420' in the NMOS area 402 are doped using the same block mask, and the intra-well connecting doped regions 418 and the deep well pockets 422' in the PMOS area 404 are doped using the same block mask.

Although the exemplary embodiments of inter-well isolation structures described herein are presented in the context of separating opposite polarity wells, the principles herein could also be applied to separating wells of the same polarity, but perhaps at different well bias levels. For example, an inter-well STI structure could isolate first and second n-wells from one another, while an intra-well STI structure in this context could isolate individual devices within the first n-well, for example.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device structure, comprising:
a p-type metal oxide semiconductor (PMOS) region and an n-type metal oxide semiconductor (NMOS) region defined in a substrate, the PMOS region and NMOS region separated by one or more inter-well shallow trench isolation (STI) structures;
the PMOS region having a first set of intra-well STI structures formed therein for isolating semiconductor devices formed within an n-type well and the NMOS region having a second set of intra-well STI structures formed therein for isolating semiconductor devices formed within a p-type well, wherein the one or more inter-well STI structures are formed at a substantially same depth with respect to the first and second sets of intra-well STI structures;
the PMOS region further having a main n-well region formed therein, and the NMOS region further having a main p-well region formed therein, wherein a bottom of the main n-well region and the main p-well region is disposed above a bottom of the one or more inter-well and first and second sets of intra-well STI features;
the PMOS region further having one or more deep n-well regions formed therein that couple main n-well and regions otherwise isolated by the first set of intra-well STI structures; and
the NMOS region further having one or more deep p-well regions formed therein that couple main p-well and regions otherwise isolated by the second set of intra-well STI structures;
wherein the one or more deep n-well and deep p-well regions are spaced away from the one or more inter-well STI structures.

2. The semiconductor device structure of claim 1, wherein the one or more deep n-well regions are disposed below both the main n-well regions and the bottoms of the first set of intra-well STI structures, and wherein the one or more deep p-well regions are disposed below both the main p-well regions and the bottoms of the second set of intra-well STI features.

3. The semiconductor device structure of claim 1, wherein the one or more deep n-well regions are localized at sidewall and bottom surfaces of the first set of inter-well STI structures, and the one or more deep p-well regions are localized at sidewall and bottom surfaces of the second set of intra-well STI structures.

* * * * *